US010262917B2

(12) United States Patent
Ishimine et al.

(10) Patent No.: US 10,262,917 B2
(45) Date of Patent: Apr. 16, 2019

(54) FLOW PASSAGE MEMBER AND SEMICONDUCTOR MODULE

(71) Applicant: KYOCERA CORPORATION, Kyoto-shi, Kyoto (JP)

(72) Inventors: Yuusaku Ishimine, Kyoto (JP); Kenji Komatsubara, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 18 days.

(21) Appl. No.: 15/128,411

(22) PCT Filed: Mar. 25, 2015

(86) PCT No.: PCT/JP2015/059165
§ 371 (c)(1),
(2) Date: Sep. 22, 2016

(87) PCT Pub. No.: WO2015/147071
PCT Pub. Date: Oct. 1, 2015

(65) Prior Publication Data
US 2017/0103935 A1   Apr. 13, 2017

(30) Foreign Application Priority Data

Mar. 25, 2014 (JP) .................... 2014-061979

(51) Int. Cl.
H01L 23/367 (2006.01)
H01L 23/373 (2006.01)
(Continued)

(52) U.S. Cl.
CPC .......... H01L 23/3675 (2013.01); B32B 18/00 (2013.01); C04B 35/584 (2013.01);
(Continued)

(58) Field of Classification Search
CPC .................... H01L 23/3675; H01L 25/072
(Continued)

(56) References Cited

U.S. PATENT DOCUMENTS 5,271,887 A * 12/1993 Wiech, Jr. ............... H01L 23/13
257/E23.004
2002/0075632 A1* 6/2002 Nakano .................. H01G 4/12
361/320
(Continued)

FOREIGN PATENT DOCUMENTS

JP  2002-329938 A  11/2002
JP  2006-308081 A  11/2006
(Continued)

OTHER PUBLICATIONS

Extended European Search Report dated Nov. 3, 2017, issued by the European Patent Office in counterpart European Patent Application No. 15 770292.9.
(Continued)

Primary Examiner — Moazzam Hossain
(74) Attorney, Agent, or Firm — Procopio Cory Hargreaves and Savitch LLP

(57) ABSTRACT

A flow passage member includes a wall formed of ceramics, a space surrounded by the wall being a flow passage through which a fluid flows, a ratio of an area occupied by a grain boundary phase in an inner surface of a wall part of the wall in which wall part heat exchange is conducted being smaller than a ratio of an area occupied by a grain boundary phase in an outer surface of the wall part.

8 Claims, 3 Drawing Sheets

(51) Int. Cl.
    *H01L 25/07*     (2006.01)
    *C04B 35/584*     (2006.01)
    *H01L 23/473*     (2006.01)
    *B32B 18/00*     (2006.01)
    *H01L 23/00*     (2006.01)
    *H05K 1/02*     (2006.01)

(52) U.S. Cl.
    CPC ........ *H01L 23/3731* (2013.01); *H01L 23/473* (2013.01); *H01L 25/072* (2013.01); *C04B 2235/3206* (2013.01); *C04B 2235/3208* (2013.01); *C04B 2235/3217* (2013.01); *C04B 2235/3224* (2013.01); *C04B 2235/3225* (2013.01); *C04B 2235/3227* (2013.01); *C04B 2235/3241* (2013.01); *C04B 2235/3258* (2013.01); *C04B 2235/3262* (2013.01); *C04B 2235/3272* (2013.01); *C04B 2235/3275* (2013.01); *C04B 2235/5409* (2013.01); *C04B 2235/80* (2013.01); *C04B 2237/368* (2013.01); *C04B 2237/582* (2013.01); *H01L 24/32* (2013.01); *H01L 24/48* (2013.01); *H01L 2224/32225* (2013.01); *H01L 2224/48227* (2013.01); *H01L 2924/00014* (2013.01); *H01L 2924/12041* (2013.01); *H01L 2924/13055* (2013.01); *H05K 1/0209* (2013.01); *H05K 2201/066* (2013.01); *H05K 2201/10106* (2013.01)

(58) Field of Classification Search
    USPC ........................................................ 257/712
    See application file for complete search history.

(56) References Cited

U.S. PATENT DOCUMENTS

| | | | |
|---|---|---|---|
| 2002/0084103 A1* | 7/2002 | Komatsu | C04B 35/584 174/255 |
| 2003/0198417 A1* | 10/2003 | Yamamoto | F16C 29/005 384/492 |
| 2010/0208427 A1* | 8/2010 | Horiuchi | H05K 7/20927 361/699 |
| 2016/0021729 A1* | 1/2016 | Nagatomo | H01L 25/07 361/748 |
| 2016/0379914 A1* | 12/2016 | Arai | H01L 25/072 257/714 |
| 2017/0271059 A1* | 9/2017 | Horiuchi | H01F 1/053 |

FOREIGN PATENT DOCUMENTS

| | | |
|---|---|---|
| JP | 2011-96994 A | 5/2011 |
| JP | 2013-048204 A | 3/2013 |
| JP | 2014-46326 A | 3/2014 |

OTHER PUBLICATIONS

Office Action dated Jan. 15, 2018 issued in counterpart Korean Application No. 10-2016-7024881.

\* cited by examiner (a)

(b)

FLOW PASSAGE MEMBER AND SEMICONDUCTOR MODULE

TECHNICAL FIELD

The present invention relates to a flow passage member and a semiconductor module.

BACKGROUND ART

Recently, semiconductor devices have been used for high-speed switching under a large amount of current. If such a semiconductor device is heated to a high temperature, its switching function may be influenced. For this reason, on the occasion of mounting a semiconductor device, a flow passage member having a flow passage capable of cooling the semiconductor device by heat exchange with a fluid is used.

As such a flow passage member, for example, in Patent Literature 1, it has been proposed a flow passage member in which a gap portion is formed as a refrigerant flow passage below a circuit for mounting a semiconductor component, and a distance t from the circuit to the gap portion in a thickness direction of a substrate satisfies a condition of 0.5 mm≤t≤5 mm, and the distance t and a width Y of the gap portion have a relation of Y≤20t.

CITATION LIST

Patent Literature

Patent Literature 1: Japanese Unexamined Patent Publication JP-A 2002-329938

SUMMARY OF INVENTION

Technical Problem

Although heat dissipation properties in a case where a flow passage for cooling a semiconductor device is provided are superior to those in a case where no flow passage is provided, recently, it has been desired to further improve the heat dissipation properties of flow path members.

The invention has been devised in order to satisfy the above described desire, and an object thereof is to provide a flow passage member having excellent heat dissipation properties and a semiconductor module.

Solution to Problem

A flow passage member of the invention comprises a wall formed of ceramics, a space surrounded by the wall being a flow passage through which a fluid flows, a ratio of an area occupied by a grain boundary phase in an inner surface of a wall part of the wall in which wall part heat exchange is conducted is smaller than a ratio of an area occupied by a grain boundary phase in an outer surface of the wall part.

In addition, a semiconductor module of the invention comprises the flow passage member having the above-described configuration, a metal layer disposed on the wall of the flow passage member, and a semiconductor device mounted on the metal layer.

Advantageous Effects of Invention

The flow passage member of the invention has excellent heat dissipation properties.

In addition, according to the semiconductor module of the invention, it is possible to keep high capability to perform high-speed switching under a large amount of current.

BRIEF DESCRIPTION OF DRAWINGS

FIG. 1 shows an example of a semiconductor module of the present embodiment, wherein FIG. 1(a) is a perspective view and FIG. 1(b) is a cross-sectional view;

FIG. 2 shows an example of a lid part constituting the flow passage member of the present embodiment, wherein FIG. 2(a) is a perspective view, FIG. 2(b) is a cross-sectional view taken along the line A-A of FIG. 2(a), and FIG. 2(c) is an enlarged view of a portion B of FIG. 2(b)

DESCRIPTION OF EMBODIMENTS

Figure 1:
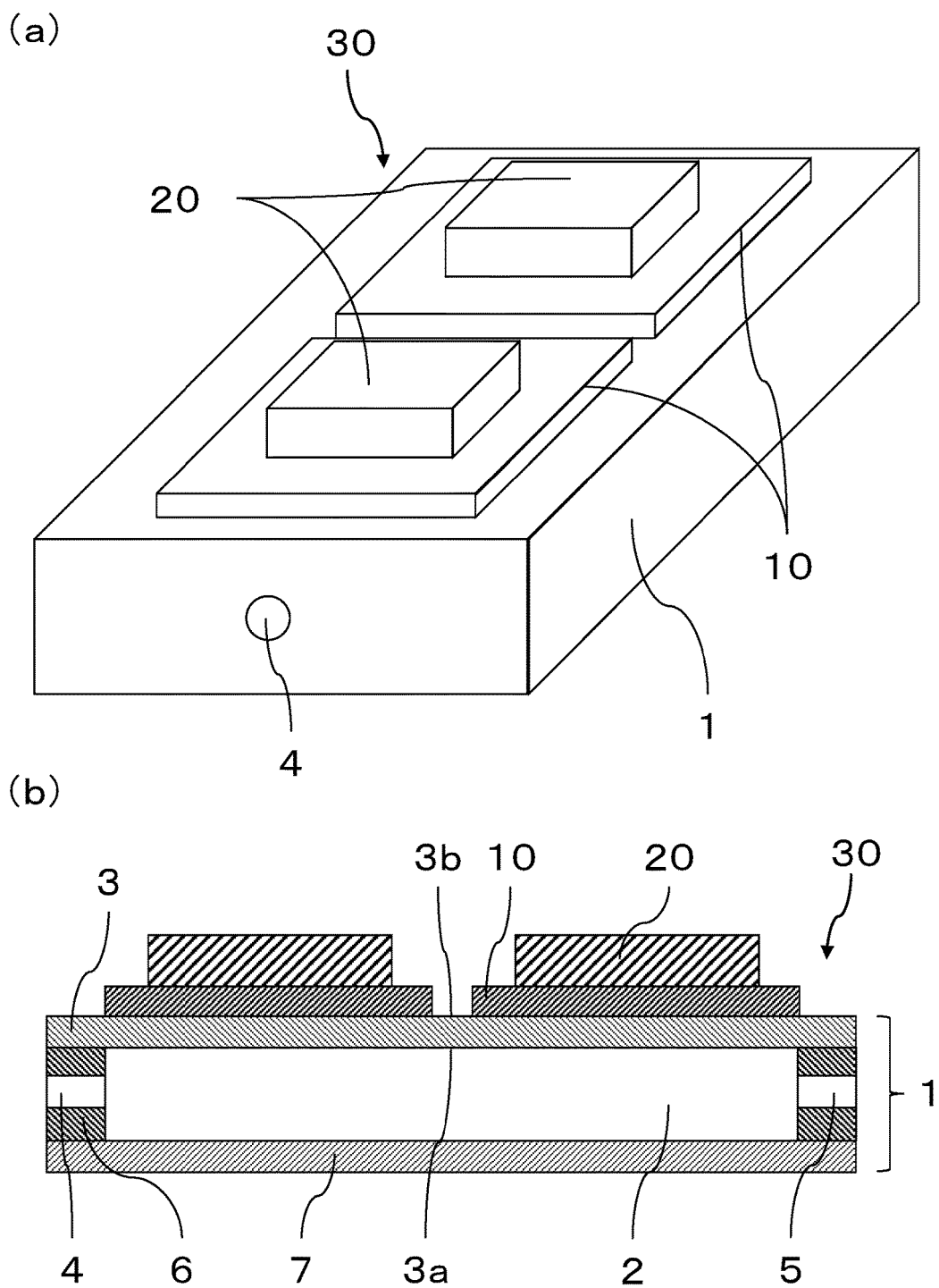

Hereinafter, an example of the present embodiment will be described with reference to the drawings. FIG. 1 shows an example of a semiconductor module of the present embodiment, wherein FIG. 1(a) is a perspective view and FIG. 1(b) is a cross-sectional view. Here, identical members are denoted by the same reference symbols.

As shown in FIG. 1(a), a semiconductor module 30 of the present embodiment comprises a flow passage member 1, metal layers 10 disposed on the flow passage member 1, and semiconductor devices 20 mounted thereon. The semiconductor devices 20 generate heat during use, and particularly, in a case where the semiconductor devices are power semiconductors such as IGBT devices or LED devices, the amount of heat generation is large.

Here, in FIG. 1, an example in which two semiconductor devices 20 are disposed on a lid part 3 is shown. However, the number of semiconductor devices 20 is not limited to two, and may be one, or three or more.

Further, in the flow passage member 1 of the present embodiment, a space surrounded by a wall (the lid part 3, a side wall part 6, and a bottom plate part 7) as shown in FIG. 1(b) is a flow passage 2 through which a fluid flows, and a refrigerant supplied from a supply port 4 passes through the flow passage 2, and is discharged from a discharge port 5. Here, in FIG. 1, the supply port 4 and the discharge port 5 are formed in the side wall part 6. However, alternations may be appropriately made. For example, the supply port 4 and the discharge port 5 may be formed in the lid part 3 and the bottom plate part 7.

Also, in the flow passage member 1 of the present embodiment, the lid part 3, the side wall part 6, and the bottom plate part 7 are formed of ceramics. Since the lid part 3, the side wall part 6, and the bottom plate part 7 are formed of ceramics as described above, the flow passage member allows a corrosive refrigerant to flow therethrough, and can be used in a corrosive environment.

Further, the flow passage member 1 of the present embodiment suppresses the temperatures of the semiconductor devices 20 from excessively rising, by heat exchange between heat generated from the semiconductor devices 20 during use and heat of the refrigerant flowing in the flow passage 2, and in the configuration shown in FIG. 1, the lid part 3 of the wall corresponds to a wall part where heat exchange is conducted. Here, in a case where the flow passage member 1 is used for mounting the semiconductor devices 20, it can be said that a wall part where heat exchange is conducted is a wall part positioned on the side where the semiconductor devices 20 are mounted. Also, in a case where the flow passage member 1 is used for heat exchange with the external environment, all of the lid part 3, the side wall part 6, and the bottom plate part 7 are wall parts where heat exchange is conducted.

In the flow passage member 1 of the present embodiment, a ratio of an area occupied by a grain boundary phase in an inner surface 3a of the lid part 3 is smaller than a ratio of an area occupied by a grain boundary phase in an outer surface 3b of the lid part 3. Here, the inner surface 3a constitutes a portion of the flow passage 2.

Since the ratio of the area occupied by the grain boundary phase in the inner surface 3a is smaller than the ratio of the area occupied by the grain boundary phase in the outer surface 3b as described above, the property of conducting heat generated by the semiconductor devices 20 from the outer surface 3b of the lid part 3 toward the inner surface 3a is improved, and it is possible to efficiently conduct heat exchange with the refrigerant flowing in the flow passage 2. Therefore, the flow passage member 1 has excellent heat dissipation properties.

Here, the property of conducting heat generated by the semiconductor devices 20 from the outer surface 3b of the lid part 3 toward the inner surface 3a is improved due to the following reason. Since the grain boundary phase has heat conductivity lower than that of the crystal phase, in the outer surface 3b where the ratio of the area occupied by the grain boundary phase is relatively large, heat generated by the semiconductor devices 20 is less prone to diffuse in a direction along the outer surface 3b (a transverse direction in FIG. 1(b)), and easily transfers toward the inner surface 3a where the ratio of the area occupied by the grain boundary phase is relatively small (a longitudinal direction in FIG. 1(b)). Therefore, the property of conducting heat generated by the semiconductor devices 20 is improved.

Here, it is preferable that the ratio of the area occupied by the grain boundary phase in the inner surface 3a is 1.0% by area or more and 4.0% by area or less. In a case where the ratio of the area occupied by the grain boundary phase in the inner surface 3a falls within the above described range, in addition to the excellent heat dissipation properties, it is possible to suppress damage of the inner surface 3a by particle shedding even if a high-pressure fluid flows.

Also, it is preferable that the ratio of the area occupied by the grain boundary phase in the outer surface 3b is 8.0% by area or more and 23.0% by area or less. In a case where the ratio of the area occupied by the grain boundary phase in the outer surface 3b falls within the above described range, in addition to the excellent heat dissipation properties, it is possible to achieve excellent mechanical properties.

Here, as a method of measuring the ratios of the areas occupied by the grain boundary phases in the inner surface 3a and the outer surface 3b of the lid part 3, for example, there is the following method. First, a sample having an appropriate size is cut off from the lid part 3, and is observed at magnification in a range of from 1000× to 6000× with a scanning electron microscope (SEM), and the location of the grain boundary phase is confirmed by elemental mapping (for example, by designing magnesium if magnesium (Mg) is included in the grain boundary phase), and an backscattered electron image is acquired. Subsequently, with respect to the acquired photo, by use of image analysis software "A-ZOKUN" (which is a registered trademark, and was produced by Asahi Kasei Engineering Corporation, and, hereinafter, the image analysis software "A-ZOKUN" means the image analysis software produced by Asahi Kasei Engineering Corporation), a threshold is set such that contrast between boundary phases and crystal phases becomes clear, and image analysis is performed. This work is performed on five arbitrary portions, whereby measurement values are obtained, and the average of those values is obtained as a ratio of an area occupied by a grain boundary phase.

Also, in the elemental mapping, it is possible to use an electron probe micro analyzer (EPMA). Here, in a case of performing polishing on the occasion of measuring the ratios of the areas occupied by the grain boundary phases, the polishing amount of the inner surface 3a and the polishing amount of the outer surface 3b are set so as to be the same within a range of about 50 μm with respect to the thickness of the lid part 3.

Also, in the lid part 3 which is a wall part where heat exchange is conducted, it is preferable that the average grain size of the inner surface 3a be larger than the average grain size of the outer surface 3b.

In a case where the above described configuration is satisfied, in the outer surface 3b, since there are a lot of boundaries interrupting heat conduction between crystal phases, heat is less prone to diffuse in the direction along the outer surface 3b, and easily transfers toward the inner surface 3a, and heat generated by the semiconductor devices 20 and the refrigerant which is a fluid flowing in the flow passage 2 can efficiently conduct heat exchange, and the heat dissipation properties is improved.

Here, for example, the average grain size of the inner surface 3a is 1.3 μm or more and 4 μm or less, and the average grain size of the outer surface 3b is 0.5 μm or more and 1 μm or less.

Here, as a method of measuring the average grain sizes of the inner surface 3a and the outer surface 3b of the lid part 3, for example, a sample having an appropriate size and including the inner surface 3a and the outer surface 3b is cut off from the lid part 3, and mirror polishing is performed on the inner surface 3a and the outer surface 3b by the same amount set within a range of about 50 μm with respect to the thickness of the lid part 3. Subsequently, both polished surfaces are observed and imaged at magnification in a range of from 1000× to 6000× with an SEM, and image analysis is performed by the image analysis software "A-ZOKUN". In this way, it is possible to obtain the average grain sizes. Here, image analysis using the image analysis software "A-ZOKUN" is based on JIS R 1670-2006.

Besides, it is possible to obtain the average grain sizes using a code method. Specifically, with respect to each photo, the grain size is measured from the number of crystal phases positioned on a straight line having a predetermined length, and this measurement is performed on a plurality of portions, and the average of measured sizes is obtained.

Also, in the flow passage member 1 of the present embodiment, in the lid part 3, it is preferable that an arithmetic average roughness Ra of the inner surface 3a is 0.2 μm or greater.

In a case where the above described configuration is satisfied, it becomes easier for turbulence of a fluid flowing in the flow passage 2 to occur on the inner surface 3a, and the efficiency of heat exchange is improved, and the heat dissipation properties of the flow passage member 1 are improved. Here, in order to suppress damage of the lid part 3 when a high-pressure fluid flows through the flow passage 2, it is preferable that the arithmetic average roughness Ra of the inner surface 3a of the lid part 3 is 1 μm or less.

Here, as a method of confirming the arithmetic average roughness Ra of the inner surface 3a of the lid part 3, for example, a sample having an appropriate size and including the inner surface 3a is cut off from the lid part 3, and the roughness is measured on the basis of JIS B 0601-2001 with a contact-type or non-contact-type roughness tester, and this measurement is performed on five arbitrary portions, and the average of measured values is obtained.

Figure 2:
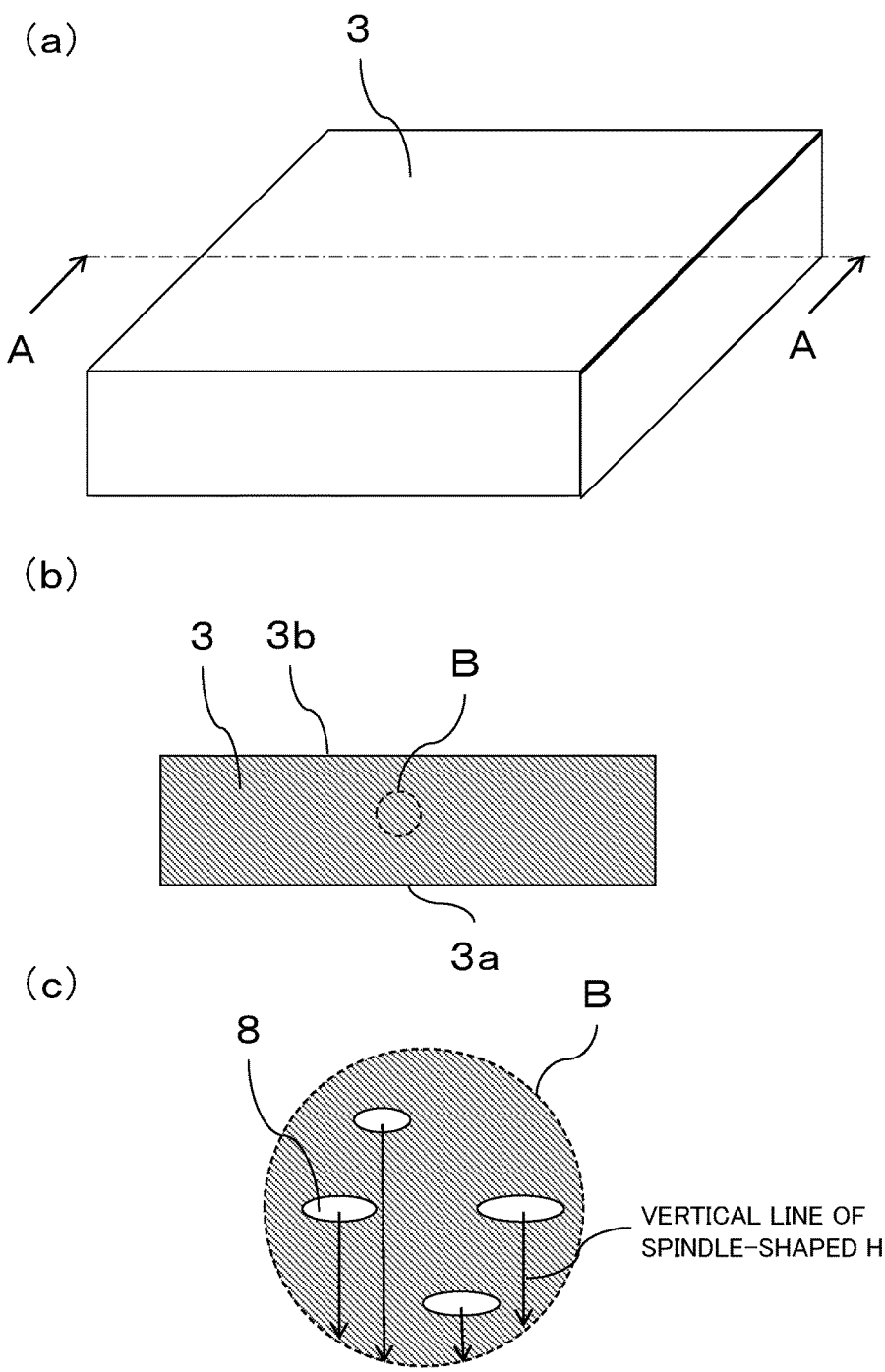
Figure 3:
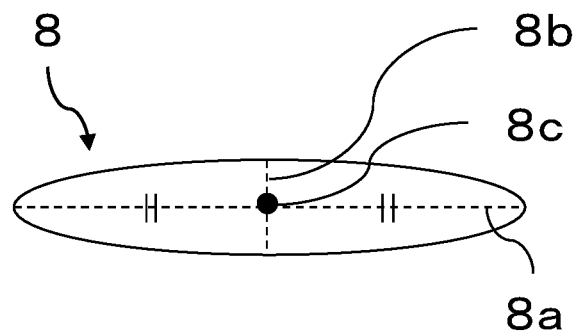
FIG. 3 is a schematic diagram illustrating an example of a shape of spindle-shaped holes.
Figure 3:
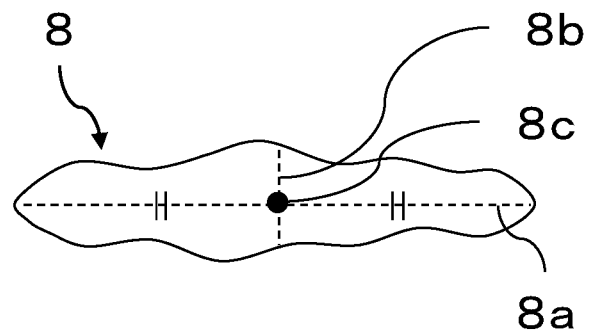

Next, FIG. 2 shows an example of the lid part 3 constituting the flow passage member of the present embodiment, wherein FIG. 2(a) is a perspective view, FIG. 2(b) is a cross-sectional view taken along the line A-A of FIG. 2(a), and FIG. 2(c) is an enlarged view of a portion B of FIG. 2(b). Also, FIG. 3 is a schematic diagram illustrating an example of a shape of spindle-shaped holes.

Preferably, the lid part 3 is provided with spindle-shaped holes 8 (hereinafter, referred to simply as the holes) in the cross section as shown in FIG. 2(b), the holes each having a long diameter 8a in a direction along the outer surface 3b. Here, the direction along the outer surface 3b means a transverse direction in FIG. 2(c).

Also, the spindle shape means a shape as shown in FIG. 3(a) and FIG. 3(b), and is a shape which is thick on the center side and tapers toward the ends. Specifically, as for the size of each spindle-shaped hole 8, the long diameter 8a which is the length in the longest direction of the corresponding hole 8 is in a range of from 10 μm to 200 μm, and when the length of a portion of the spindle-shaped hole perpendicular to the long diameter 8a at the midpoint 8c of the long diameter 8a is defined as a short diameter 8b, the ratio obtained by dividing the long diameter 8a by the short diameter 8b is 2 or more.

Further, in the case where the lid part 3 is provided with the spindle-shaped holes 8 each having the long diameter 8a in the direction along the outer surface 3b, even if repeated heat transfer causes micro cracks in crystal phase boundaries and the like, it is possible to suppress extension of the cracks. Also, since the lid part 3 has more excellent mechanical properties as compared to a case where the lid part 3 is provided with holes each having a long diameter in a direction along the thickness direction (the longitudinal direction in FIG. 2(c)) of the lid part 3, it is possible to use the lid part 3 for a long time.

Also, it is preferable that the lid part 3 is provided with a plurality of spindle-shaped holes 8 each of which has a long diameter 8a in the direction along the outer surface 3b and is arranged in the thickness direction, and vertical lines (arrows shown in FIG. 2(c)) from the midpoints of the long diameters 8a of the individual holes do not overlap with each other in the thickness of the lid part 3. In a case where the above described configuration is satisfied, it is possible to suppress extension of micro cracks while having more excellent mechanical properties as compared to a case where the vertical lines overlap with each other in the thickness of the lid part 3. Also, it is possible to reduce the likelihood that micro cracks are generated due to localization of heat conducted from the outer surface 3b.

Here, as a method of confirming the spindle-shaped holes 8 each having the long diameter 8a in the direction along the outer surface 3b, it is possible to confirm the holes by cutting off a cross section (a cross section along the line A-A of FIG. 2(a)) perpendicular to the outer surface 3b from the lid part 3, and observing the cross section with a known microscope (such as a metallograph or an SEM) at magnification in a range of from 1000× to 2000×. Also, whether the lid part 3 is provided with the plurality of spindle-shaped holes 8 arranged in the thickness direction may be determined based on whether spindle-shaped holes 8 are observed in a plurality of areas by observing different areas in the thickness direction. Also, whether the vertical lines from the midpoints of the long diameters 8a of the individual spindle-shaped holes 8 overlap with each other in the thickness of the lid part 3 may be determined by shifting an observation area from the confirmed spindle-shaped holes 8 toward the outer surface 3b and the inner surface 3a in the vertical direction and observing the area.

Next, examples of ceramics forming the flow passage member 1 include alumina, zirconia, mullite, silicon carbide, boron carbide, cordierite, silicon nitride, aluminum nitride, and a sintered body formed of a composite material thereof. Since the wall constituting the flow passage member 1 are formed of ceramics as described above, it is possible to form the metal layers 10 such as wire conductors directly on the flow passage member 1 as shown in FIG. 1, and thus it is possible to mount electronic components such as the semiconductor devices 20 on the metal layers 10. As a result, it is possible to reduce the number of components, and it is possible reduce the thermal resistance at junctions in proportion to a reduction in the number of junctions of components, and it is possible to improve the efficiency of heat exchange.

Especially, it is preferable that the lid part 3 shown in FIG. 1 is composed of a silicon nitride sintered body. Here, the silicon nitride sintered body is a sintered body containing 70% by mass or more of silicon nitride with respect to 100% by mass of all components constituting the sintered body. In a case where the lid part 3 is composed of a silicon nitride sintered body, since the silicon nitride sintered body has high withstand voltage and high resistance to thermal shock, it is possible to withstand even use of the lid part 3 under a large amount of current, and it is possible to make it difficult for damage such as cracks to occur even in a case where the amount of heat generation of the electronic components is large.

Here, with respect to the components constituting the lid part 3, it is possible to cut off a sample having an appropriate size from the lid part 3 and confirm those components with an X-ray diffractometer (XRD). Also, their contents can be confirmed by performing energy dispersive X-ray (EDS) analysis with an SEM. Also, an ICP emission spectrophotometer or an X-ray fluorescence spectrometer can also be used for confirming the contents.

Also, in the case where the lid part 3 is composed of a silicon nitride sintered body, it is preferable that, in the inner surface 3a, compounds containing iron and silicon are scattered, and the number of compounds, having circle-equivalent diameters of 0.05 μm or more and 5 μm or less, per 1 mm$^2$ is $2.0 \times 10^4$ or more and $2.0 \times 10^5$ or less.

In a case where the above described configuration is satisfied, when a high-pressure fluid flows through the flow passage 2, even if pressure on the inner surface 3a of the lid part 3 causes cracks, since the compounds containing iron and silicon are scattered, it is possible to suppress extension of the cracks toward the inner side of the lid part 3. Here, it is preferable that the compounds containing iron and silicon exist at the grain boundary phase of the lid part 3.

Here, whether the compounds containing iron and silicon are scattered can be confirmed by confirming whether there is a plurality of portions where Fe existence positions and Si existence positions overlap with each other by elemental mapping using an EPMA. Here, the compounds may be identified by measurement using an XRD.

Also, the number of compounds, containing iron and silicon and having circle-equivalent diameters of 0.05 μm or more and 5 μm or less, per 1 mm$^2$ may be analyzed at 1000× magnification with an SEM, for example, by setting a range such that an area becomes $10.8 \times 10^4$ μm$^2$ (wherein the length in the transverse direction is 127 μm and the length in the longitudinal direction is 85.3 μm), and taking a backscattered electron image of that area with a CCD camera, and performing a method called particle analysis, using the image analysis software "A-ZOKUN".

Here, as the setting conditions of this method, lightness may be set to be high, and a binarization method may be set to a manual method, and a threshold which is an indicator representing the tone of the backscattered electron image may be set to, for example, 1.5 times to 1.8 times the peak value of a histogram representing the brightness of individual points (individual pixels) of the backscattered electron image. Here, instead of the SEM, an optical microscope may be used. Such work may be performed on five arbitrary portions, and the average of obtained values may be obtained.

Also, in the flow passage member 1 of the present embodiment, in the case where the lid part 3 is composed of a silicon nitride sintered body, it is preferable that the inner surface 3a of the lid part 3 has recesses, and crossing columnar crystals exist in the recesses.

In a case where the above described configuration is satisfied, if a fluid flowing in the flow passage 2 flows into the recesses where the columnar crystals cross, the flow of the fluid is stirred. Therefore, the efficiency of heat exchange is improved, and the heat dissipation properties of the flow passage member 1 are improved.

Here, with respect to the sizes of the recesses, it is preferable that the maximum widths of their openings are 20 μm or more and 100 μm or less, and as a method of confirming the recess size, it is possible to confirm the size at magnification in a range of from 200× to 500× with an SEM.

Here, the state where columnar crystals cross in the recesses can be confirmed at higher magnification in a range of from 1000× to 3000× with an SEM. Also, the state where columnar crystals cross means a state where the axes of the columnar crystals cross at arbitrary angles.

Also, the semiconductor module 30 of the present embodiment is configured by mounting the semiconductor devices 20 on the metal layers 10 disposed on the lid part 3 of the flow passage member 1.

For example, in a case of mounting a plurality of semiconductor devices 20 on the lid part 3 of the flow passage member 1 as shown in FIG. 1, since heat is less prone to diffuse in the direction along the outer surface 3b in the lid part 3, it is possible to inhibit each of the semiconductor devices 20 from being interfered by heat generated by different semiconductor devices 20. Further, since heat generated by the semiconductor devices 20 easily transfers toward the inner surface 3a of the lid part 3, it is possible to efficiently perform heat dissipation of the semiconductor devices 20, and it is possible to perform high-speed switching under a large amount of current.

Here, it is preferable that the metal layer 10 contains copper, silver, aluminum, or the like as a main component. Since the metal layer 10 containing the material as the main component has a low electrical resistivity, it is possible to cope with even a case where the amount of allowable current is large. Also, since the heat conductivity is high, it is possible to use the metal layer 10 as a heat dissipation member.

Also, in the above description, the example in which a heat source is the semiconductor device 20 has been described. However, the heat source is not limited to the semiconductor device 20, and may be a sublimation-type thermal printer head element, a thermal inkjet printer head element, and so on.

Also, although not shown, the metal layer 10 and the semiconductor device 20 can be connected to another circuit board and an external power supply by a bonding wire or the like.

Here, the flow passage member 1 of the present embodiment may have a partition wall part for changing or bifurcating the direction of the flow of a fluid therein. If the partition wall part is provided, it is possible to efficiently cool the semiconductor device 20 and so on.

Now, as an example of a method of manufacturing the flow passage member of the present embodiment, an example in which the flow passage member is composed of a silicon nitride sintered body will be described.

Here, in the following description, as a method of manufacturing the lid part 3 of the flow passage member 1 of the present embodiment, an example in which the lid part is manufactured by a stacking method using ceramic green sheets will be described.

First, powder of silicon nitride having a 6-type formation rate of 20% or less, powder of oxide of at least one of magnesium (Mg), calcium (Ca), aluminum (Al), molybdenum (Mo), chromium (Cr), nickel (Ni), manganese (Mn), and tungsten (W) which is an sintering additive, and powder of oxide of a rare-earth element (for example, at least one of $Sc_2O_3$, $Y_2O_3$, $La_2O_3$, $Ce_2O_3$, $Pr_6O_{11}$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, and $Lu_2O_3$) are weighed by desired amounts. Subsequently, the powders are put in a tumbling mill containing balls formed of ceramics, and are mixed and milled, and then are mixed with an organic binder such as paraffin wax, polyvinyl alcohol (PVA), or polyethylene glycol (PEG), whereby a slurry is prepared.

In a case where the total sum of the silicon nitride powder and the sintering additive powder is 100% by mass, the above described sintering additive may be made such that powder of oxide of at least one of magnesium (Mg), calcium (Ca), aluminum (Al), molybdenum (Mo), chromium (Cr), nickel (Ni), manganese (Mn), and tungsten (W) becomes 2 to 7% by mass, and powder of oxide of the rare-earth element becomes 7 to 16% by mass.

Here, in the method of manufacturing the flow passage member of the present embodiment, the starting material A of a ceramic green sheet for forming the inner surface 3a of the lid part 3 and the starting material B of a ceramic green sheet for forming the outer surface 3b of the lid part 3 are prepared so as to be different in their compositions. Specifically, it is possible to make the content of sintering additive powder in the starting material A less than that in the starting material B, thereby making the ratio of the area occupied by the grain boundary phase in the inner surface 3a of the lid part 3 smaller than the ratio of the area occupied by the grain boundary phase in the outer surface 3b.

Here, in a case of making the lid part 3 thick, a starting material C having the content of sintering additive powder larger than that of the starting material A and less than that of the starting material B may be prepared, and be interposed between the ceramic green sheet formed of the starting material A and the ceramic green sheet formed of the starting material B.

Also, on the basis of 100 parts by weight of the starting material A, 1 part by weight or more, and 1.7 parts by weight or less of iron oxide powder having specific surface area in a range of 0.5 $m^2$/g to 50 $m^2$/g may be added. Iron oxide releases oxygen by reaction with silicon during sintering, whereby silicide which is a thermodynamically stable compound formed of iron and silicon is produced. Also, by containing iron oxide powder having the specific surface area and the content described above, it is possible to make compounds containing iron and silicon be scattered in the inner surface 3a of the lid part 3, and make the number of compounds, having circle-equivalent diameters of 0.05 μm or more and 5 μm or less, per 1 mm² be equal to or larger than $2.0 \times 10^4$ and be equal to or smaller than $2.0 \times 10^5$.

Here, on the occasion of making a silicon nitride sintered body, it is preferable to use balls composed of a silicon nitride sintered body as the balls which are formed of ceramics and used for mixing and milling the silicon nitride powder and the sintering additive powder. Also, in terms of improvement of sinterability and formation of columnar or acicular crystal structures, it is preferable to mix and mill the silicon nitride powder and the sintering additive powder until a grain size ($D_{90}$) at 90% cumulative volume in a case where the total cumulative volume of the particle size distribution curve is 100% becomes 3 μm or less.

Here, in order to perform mixing and milling within a short time, it is preferable to use powder formed in advance so as to have a grain size ($D_{50}$) of 1 μm or less at 50% cumulative volume. Also, the size of particles which are milled can be adjusted by the external diameter of the balls, the amount of balls, the viscosity of slurries, milling time, and the like. In order to decrease the viscosity of a slurry, a dispersant may be added. By such adjustment, the diameters of particles which are milled can be adjusted, and thus the average grain sizes in the inner surface 3a and the outer surface 3b can be adjusted.

Subsequently, sheets are prepared using the obtained slurries by a doctor blade method. Subsequently, the obtained sheets are punched out with a die or are subjected to laser machining, whereby ceramic green sheets which have predetermined shapes and will form the inner surface 3a and the outer surface 3b of the lid part 3 are obtained.

Also, as another method of manufacturing those compacts, it is possible to prepare granules by spraying and drying the obtained slurries, and form the granules into sheets by cold isostatic pressing (CIP), extrusion molding, pressing, or otherwise, and cut the sheets into predetermined shapes. Further, sheets formed by a roll compaction method of extending granules by applying pressure may be punched out with a die or are subjected to laser machining, whereby it is possible to obtain ceramic green sheets which have predetermined shapes and will form the inner surface 3a and the outer surface 3b of the lid part 3.

Subsequently, a slurry is applied to at least one surface to become a bonded surface of the ceramic green sheet for forming the inner surface 3a of the lid part 3 and the ceramic green sheet for forming the outer surface 3b, and the ceramic green sheets are stacked and pressed, whereby it is possible to obtain a compact which is a stacked body to become the lid part 3. Here, as described above, in a case of making the lid part 3 thick, the ceramic green sheet for forming the inner surface 3a of the lid part 3 and the ceramic green sheet for forming the outer surface 3b may be stacked with a ceramic green sheet formed of the starting material C interposed therebetween.

Subsequently, blasting is performed on a surface of the compact corresponding to the inner surface 3a of the lid part 3, whereby it is possible to adjust the arithmetic average roughness Ra after firing.

Further, in order to form the spindle-shaped holes 8 each having the long diameter 8a in the direction along the outer surface 3b, in the lid part 3, when the slurry is applied to the bonded surface, the slurry needs to be applied except for a circular area, and in order to form a plurality of spindle-shaped holes 8 such that the vertical lines from the midpoints 8c of the long diameters 8a of the individual spindle-shaped holes 8 do not overlap with each other in the thickness of the lid part 3, in a case where the number of layers which are stacked is 3 or more, circular areas where the slurry is not applied need to be arranged so as not to overlap with each other at each bonded surface.

Also, as a method of manufacturing compacts for the side wall part 6 and the bottom plate part 7 constituting the flow passage member 1 except for the lid part 3, it is possible to manufacture those compacts by forming granules into block-shaped compacts by CIP, extrusion molding, or otherwise, and cutting the formed compacts such that the shape of the flow passage 2 is obtained, and in a case of manufacturing the lid part 3 by the stacking method, it is preferable to manufacture the side wall part 6 and the bottom plate part 7 by the stacking method. In the stacking method, it is possible to easily change thickness by changing the number of ceramic green sheets which are stacked. Also, by stacking ceramic green sheets made in desired shapes by punching using a die or laser machining, it is possible to manufacture a flow passage member 1 having a complicated flow passage 2 like a flow passage having partition wall parts.

Also, in manufacturing the side wall part 6 and the bottom plate part 7 by the stacking method, it is possible to manufacture them by the same method as that in the case of manufacturing a compact to become the lid part 3 described above, and it may be possible to obtain each of compacts to become the side wall part 6 and the bottom plate part 7 by stacking, and it may be possible to obtain a compact having the lid part 3, the side wall part 6, and the bottom plate part 7 by performing stacking and pressing at the same time.

Here, with respect to the supply port 4 and the discharge port 5, in a case where they are formed in the side wall part 6 as shown in FIG. 1, holes may be formed in a compact having the lid part 3, the side wall part 6, and the bottom plate part 7, however, machining scraps remain inside. Therefore, it is preferable to form holes at the stage of ceramic green sheets.

Subsequently, the obtained compact is put into a sagger composed of a silicon nitride sintered body. Here, at this time, in order to suppress volatilization of the components contained in the silicon nitride sintered body, a co-material containing components such as magnesium oxide and oxide of a rare-earth element is disposed around the silicon nitride sintered body, and is put and fired in a firing furnace having a graphite resistance heating element. It is preferable that an amount of the co-material is 2% by mass or more and is less than 10% by mass, on the basis of the total mass of the silicon nitride sintered body.

Also, with respect to a firing condition, the temperature is raised from a room temperature to 300-1000° C., at a vacuum atmosphere and then nitrogen gas is introduced, and the partial pressure of nitrogen is maintained at 15 to 900 kPa. Thereafter, the temperature is further raised, and is maintained in a range of 1560° C. or higher and 1640° C. or lower for a period of longer than 4 hours and 6 hours or shorter, and then the temperature is further raised, and is maintained in a range of 1740° C. or higher and lower than 1800° C. for a period of 4 hours or longer and 10 hours or shorter. Thereafter, cooling is performed at a temperature drop rate of 500° C./h or more, whereby it is possible to obtain the flow passage member 1 of the present embodiment. Here, depending on the intended use, the flow passage member 1 may be polished.

Until now, the manufacturing method of manufacturing the lid part 3 by stacking a plurality of ceramic green sheets has been described. However, as another manufacturing method for controlling the ratios of the areas occupied by the grain boundary phases in the inner surface 3a and the outer surface 3b of the lid part 3, the following method is exemplified.

First, ceramic green sheets formed of the starting material A are formed into desired shapes by punching using a die or laser machining, and a slurry is applied to bonded surfaces, and the ceramic green sheets are stacked and pressed, whereby a compact having the lid part 3, the side wall part 6, and the bottom plate part 7 is obtained.

Subsequently, the compact is mounted such that the outer surface 3b of the lid part 3 is positioned on a bed of powder of the above-described common material. Then, firing is performed according to the above-described condition. If firing is performed by the above-described method, in the outer surface 3b of the lid part 3, it is difficult for components constituting the grain boundary phase to evaporate, and in the inner surface 3a, evaporation of the grain boundary phase is less suppressed as compared to the outer surface 3b. Therefore, when comparing the inner surface 3a and the outer surface 3b, the ratio of the area occupied by the grain boundary phase in the inner surface 3a is small, and the ratio of the area occupied by the grain boundary phase in the outer surface 3b is large. Also, due to the difference in the amount of evaporation of the grain boundary phase, a difference in the effect of suppressing the growth in grains of crystal phases occurs. Therefore, when comparing the inner surface 3a and the outer surface 3b, the average grain size in the inner surface 3a is large, and the average grain size in the outer surface 3b is small.

Subsequently, it is possible to manufacture the semiconductor module 30 of the present embodiment by providing the metal layers 10 on the lid part 3 of the flow passage member 1, and mounting the semiconductor devices 20 on the metal layers 10.

Here, with respect to the metal layers 10 which are disposed on the lid part 3, it may be possible to produce paste using conductive powder such as silver, copper, or aluminum, glass powder, and an organic vehicle, and print the obtained paste on the outer surface 3b of the lid part 3 by a known screen printing method, and dry the paste, and fire the lid part 3 at an atmosphere suitable for the conductive powder. Also, as another manufacturing method, it may be possible to manufacture the metal layers 10 by electrolytic plating, non-electrolytic plating, or direct bonding using copper plates or aluminum plates, or active metal soldering.

Although the invention has been described above in detail, the invention is not limited to the above described embodiment, and various changes, modifications and the like are possible without departing from the scope of the invention, and the side wall part and the bottom plate part do not need to have a configuration different from that of the lid part, and may have the same configuration as that of the lid part.

Also, for example, the flow passage member of the invention can used for mounting electronic components such as semiconductor devices, and can also be used as a member for a heat exchanger for performing heat exchange between a high-temperature fluid flowing outside the flow passage member and a refrigerant flowing in the flow passage member.

REFERENCE SIGNS LIST

1: Flow passage member
2: Flow passage
3: Lid part
3a: Inner surface
3b: Outer surface
4: Supply port
5: Discharge port
6: Side wall part
7: Bottom plate part
8: Spindle-shaped hole (hole)
10: Metal layer
20: Semiconductor device
30: Semiconductor module

The invention claimed is:

1. A flow passage member formed of ceramics, comprising:
   a lid part;
   a bottom plate part opposed to the lid part;
   two side wall parts, each connecting the lid part with the bottom plate part;
   a flow passage disposed in the base body, surrounded by the lid part, the bottom wall and the side walls, and allowing a fluid to flow therethrough,
   wherein the lid part comprising:
      an inner surface of the lid part that faces the bottom plate part, that is configured to contact the fluid, and that has a first ratio of an area occupied by a grain boundary phase; and
      an outer surface of the lid part that is opposed to the inner surface, that comprises a mounting area for a heat source, and that has a second ratio of an area occupied by a grain boundary phase, wherein the first ratio is smaller than the second ratio.

2. The flow passage member according to claim 1, wherein the lid part comprises ceramic grains therein, the ceramic grains having an average grain size of the inner surface that is larger than an average grain size of the outer surface.

3. The flow passage member according to claim 1, wherein an arithmetic average roughness Ra on the inner surface is 0.2 µm or more.

4. The flow passage member according to claim 1, wherein the lid part comprises a first spindle-shaped hole in a cross section perpendicular to the outer surface, the first spindle-shaped hole having a first longest diameter in a first direction along the outer surface.

5. The flow passage member according to claim 4, wherein
   the lid part further comprises a second spindle-shaped hole having a second longest diameter in a second direction along the outer surface,
   the first spindle-shaped hole has a first vertical line at a midpoint of the first longest diameter, the first vertical line being perpendicular to the first direction, and
   the second spindle-shaped hole has a second vertical line at a midpoint of the second longest diameter, the second vertical line being perpendicular to the second direction, and does not overlap with the first vertical line within the lid part.

6. The flow passage member according to claim 1, wherein the lid part is composed of a silicon nitride sintered body.

7. The flow passage member according to claim 6, wherein,
   the lid part contains a compound including iron and silicon dispersed therein, and
   the compound having circle-equivalent diameters of 0.05 µm or more and 5 µm or less has $2.0 \times 10^4$ or more and $2.0 \times 10^5$ or less pieces in 1 mm².

8. A semiconductor module, comprising:
the flow passage member according to claim 1;
a metal layer disposed on the mounting are; and
a semiconductor device mounted on the metal layer.

* * * * *